US011211472B2

(12) United States Patent
Wang et al.

(10) Patent No.: US 11,211,472 B2
(45) Date of Patent: Dec. 28, 2021

(54) SEMICONDUCTOR DEVICE AND METHOD OF FORMING THE SAME

(71) Applicant: TAIWAN SEMICONDUCTOR MANUFACTURING CO., LTD., Hsinchu (TW)

(72) Inventors: Pei-Hsun Wang, Kaohsiung (TW); Shih-Cheng Chen, New Taipei (TW); Kuo-Cheng Chiang, Hsinchu County (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/799,650

(22) Filed: Feb. 24, 2020

(65) Prior Publication Data

US 2021/0265483 A1 Aug. 26, 2021

(51) Int. Cl.
| | | |
|---|---|---|
| *H01L 29/66* | (2006.01) | |
| *H01L 21/8234* | (2006.01) | |
| *H01L 27/088* | (2006.01) | |
| *H01L 27/092* | (2006.01) | |
| *H01L 29/423* | (2006.01) | |
| *H01L 29/49* | (2006.01) | |
| *H01L 29/78* | (2006.01) | |

(52) U.S. Cl.
CPC .... *H01L 29/6656* (2013.01); *H01L 29/66795* (2013.01); *H01L 29/7851* (2013.01)

(58) Field of Classification Search
CPC ....... H01L 21/02603; H01L 21/823431; H01L 21/823821; H01L 27/0924; H01L 29/66553; H01L 29/6656; H01L 29/66795; H01L 29/785; H01L 29/7851; H01L 27/0886; H01L 27/10879; H01L 27/1211; H01L 27/41791; H01L 29/0653; H01L 29/6653; H01L 29/7853; H01L 29/7855; H01L 2029/7858
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,419,101 B1 * | 8/2016 | Peng | H01L 29/66545 |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2017/0133489 A1 * | 5/2017 | Zhou | H01L 29/7853 |
| 2018/0166560 A1 * | 6/2018 | Chiang | H01L 29/66795 |

\* cited by examiner

*Primary Examiner* — David C Spalla
(74) *Attorney, Agent, or Firm* — Maschoff Brennan

(57) ABSTRACT

A semiconductor device includes a semiconductor substrate having a fin structure, a gate stack across the fin structure, a spacer structure on a sidewall of the gate stack, an epitaxial structure on the semiconductor substrate, and a dielectric structure in the spacer structure. The dielectric structure extends along a lower portion of the spacer structure and across the fin structure.

20 Claims, 20 Drawing Sheets

SEMICONDUCTOR DEVICE AND METHOD OF FORMING THE SAME

BACKGROUND

The electronics industry has experienced a growing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far, these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
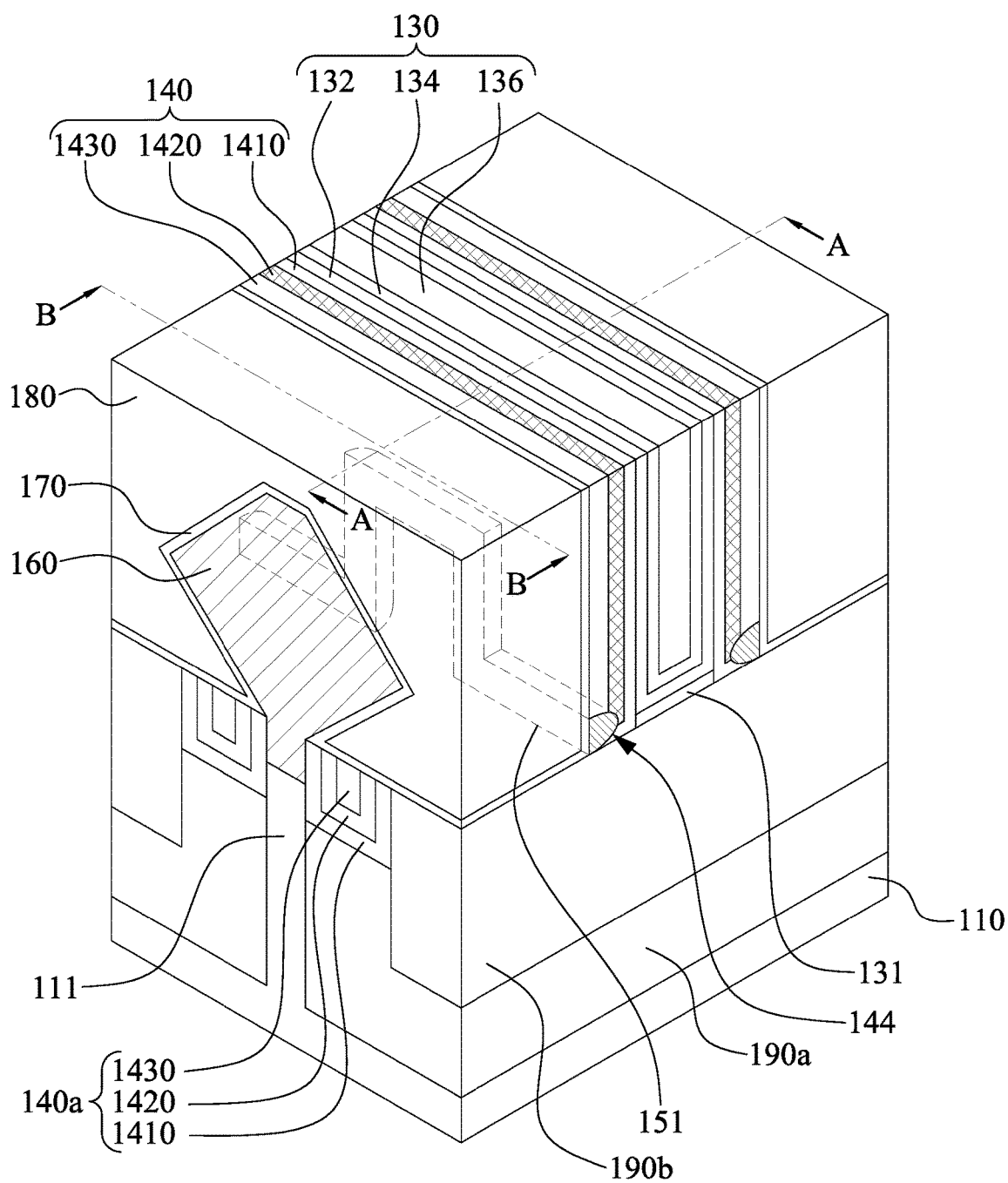
FIG. 1 is a perspective view of a semiconductor device according to some embodiments of the present disclosure.

The following disclosure provides many different embodiments, or examples, for implementing different structures of the provided subject matter. Specific examples of components and arrangements are described below to simplify the present disclosure. These are, of course, merely examples and are not intended to be limiting. For example, the formation of a first structure over or on a second structure in the description that follows may include embodiments in which the first and second structures are formed in direct contact, and may also include embodiments in which additional structures may be formed between the first and second structures, such that the first and second structures may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or structure's relationship to another element(s) or structure(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 2A:
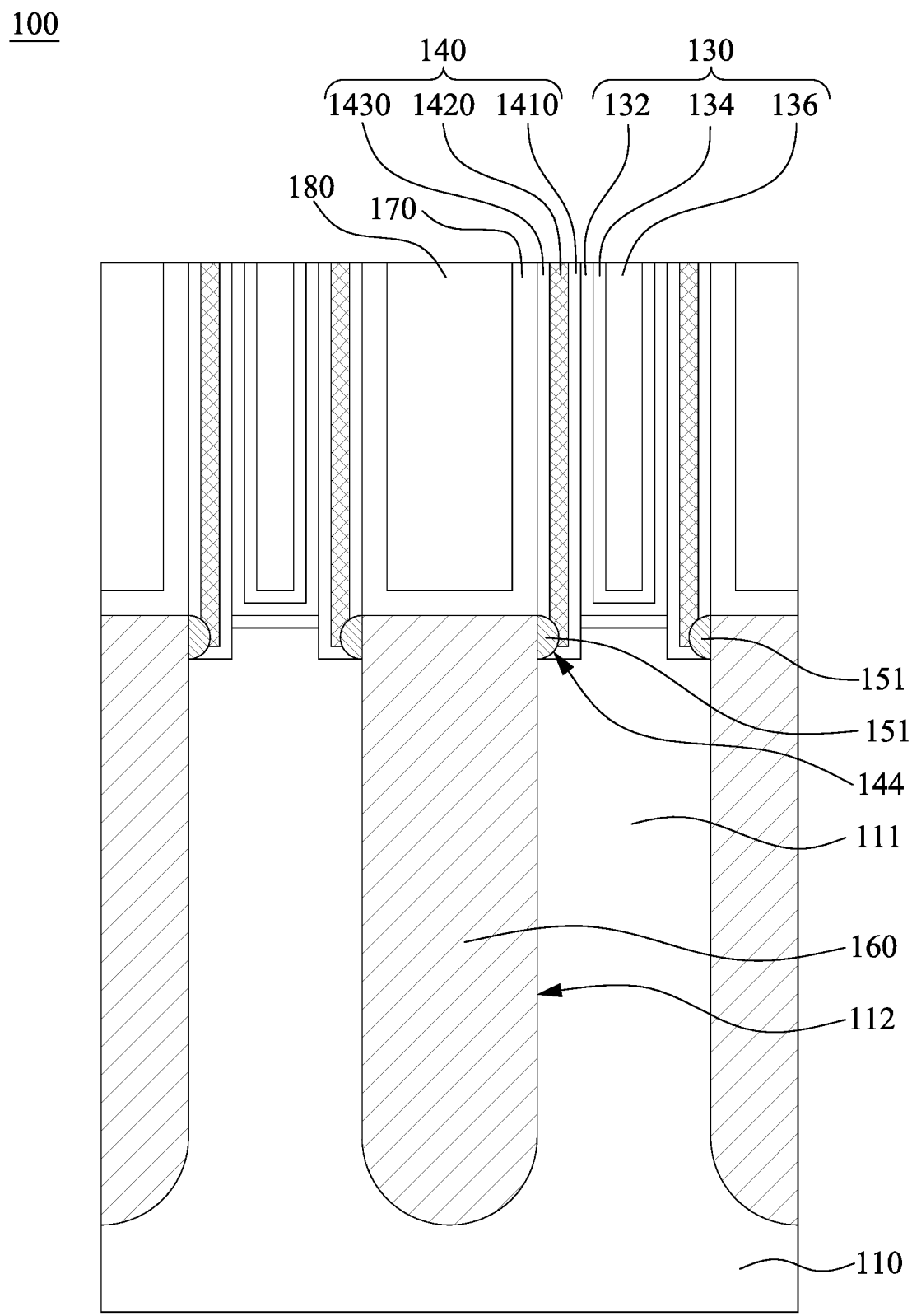
FIG. 2A is a cross-sectional view of the semiconductor device taken along line A-A of FIG. 1.

FIG. 1 is a perspective view of a semiconductor device 100 according to some embodiments of the present disclosure. FIG. 2A is a cross-sectional view of the semiconductor device 100 taken along line A-A of FIG. 1. Reference is made to FIGS. 1 and 2A. The semiconductor device 100 includes a semiconductor substrate 110, a gate stack 130 (e.g., a metal gate stack), a spacer structure 140, an epitaxial structure 160, and a dielectric structure 151. The semiconductor substrate 110 may be made of a semiconductor material such as silicon or the like, and includes a fin structure 111. The gate stack 130 is arranged over the semiconductor substrate 110. Specifically, the gate stack 130 is arranged over and across the fin structure 111 and on an interfacial layer 131. The spacer structure 140 is disposed on a sidewall of the gate stack 130. Further, the spacer structure 140 is over and across the fin structure 111. In some embodiments, the fin structure 111 has a fin recess 112 at a side of the spacer structure 140 facing away from the gate stack 130. The epitaxial structure 160 is formed on the semiconductor substrate 110, and protrudes from the fin recess 112. The dielectric structure 151 is located in the spacer structure 140, and extends along a lower portion of the spacer structure 140 and across the fin structure 111.

In some embodiments, the spacer structure 140 includes a first spacer layer 1410, a second spacer layer 1420, and a third spacer layer 1430, and the second spacer layer 1420 is between the first spacer layer 1410 and the third spacer layer 1430. The second spacer layer 1420 has a lower dielectric constant than the first spacer layer 1410 and the third spacer layer 1430. The second spacer layer 1420 is spaced apart from the epitaxial structure 160 due to the dielectric structure 151. In other words, the second spacer layer 1420 and the epitaxial structure 160 are separated by the dielectric structure 151. The third spacer layer 1430 has a sidewall substantially aligned with a sidewall of the dielectric structure 151. In some embodiments, the first spacer layer 1410 is a low-k spacer, and may be made of a material such as silicon oxycarbonitride (SiOCN), silicon oxycarbide (SiOC), silicon carbon nitride (SiCN), silicon nitride (SiN), or the like. The second spacer layer 1420 is an ultra-low-k spacer. The third spacer layer 1430 is a low-k spacer, and may be made of a material such as silicon carbon nitride (SiCN), silicon nitride (SiN), or the like. The dielectric constant of the second spacer layer 1420 is lower than the dielectric constants of the first spacer layer 1410 and the third spacer layer 1430. In some embodiments, the dielectric constants of the first spacer layer 1410 and the third spacer layer 1430 are greater than 4 (k>4), and the dielectric constant of the second spacer layer 1420 is less than 4 (k<4). If the dielectric constants of first spacer layer 1410 and the third spacer layer 1430 are less than 4, they will be damaged by subsequent processes. In addition, the first spacer layer 1410 has a thickness in a range from about 2 nm to about 4 nm, the second spacer layer 1420 has a thickness in a range from about 2 nm to about 4 nm, and the third spacer layer 1430 has a thickness in a range from about 2 nm to about 3 nm. If the thicknesses of the first and second spacer layers 1410 and 1420 are greater than 4 nm and the thickness of the third spacer layer 1430 is greater than 3 nm, the resistance from a channel region to a source/drain structure (i.e., epitaxial structure 160) will be too high, and poly to poly space (e.g., space between two adjacent dummy gate layers 133 of FIG. 5A) will be increased to affect device density. If the thicknesses of the first, second, and third spacer layers 1410, 1420, and 1430 are less than 2 nm, electrical leakage will be prone to occur.

Moreover, the gate stack 130 includes a gate dielectric 132, a work function layer 134, and a gate electrode 136 from bottom to top. The gate dielectric 132 is on the fin structure 111, the gate electrode 136 is on the gate dielectric 132, and the work function layer 134 is between the gate dielectric 132 and the gate electrode 136. The gate dielectric 132 may include a high-k material. The spacer structure 140 is located on a sidewall of the gate dielectric 132 and a sidewall of the gate electrode 136. The spacer structure 140 has a recessed face 144 with a curved shape at a position proximal to the fin structure 111. In some embodiments, the recessed face 144 of the spacer structure 140 is defined by concave faces of the first spacer layer 1410, the second spacer layer 1420, and the third spacer layer 1430, but the embodiments of the present disclosure are not limited in this regard. For example, the recessed face 144 may be also defined by concave faces of the second spacer layer 1420 and the third spacer layer 1430.

In some embodiments, the dielectric structure 151 is made of a material such as silicon oxycarbonitride (SiOCN), silicon oxycarbide (SiOC), silicon carbon nitride (SiCN), silicon nitride (SiN), or the like. The dielectric structure 151 is between the gate stack 130 and the epitaxial structure 160, and acts as a corner spacer for the gate stack 130. Although the dielectric structure 151 may be made of the same material as the first spacer layer 1410, the dielectric structure 151 may have different dielectric constant from the first spacer layer 1410 through modifying process to enable the dielectric structure 151 and the first spacer layer 1410 have different film densities and element ratios. The dielectric structure 151 is in contact with the epitaxial structure 160. In addition, the dielectric structure 151 is located in the spacer structure 140 and has an inner face conformal to the recessed face 144 of the spacer structure 140. The recessed face 144 of the spacer structure 140 faces away from the gate electrode 136. The inner face of the dielectric structure 151 is in contact with the recessed face 144 of the spacer structure 140. The dielectric structure 151 extends in an extension direction (i.e., a lengthwise direction) along the recessed face 144 of the spacer structure 140. Because the recessed face 144 has an arc shape in cross section, the dielectric structure 151 has non-uniform thicknesses in a direction substantially perpendicular to the extension direction of the dielectric structure 151. That is, the thickness of the dielectric structure 151 at the center of the dielectric structure 151 is greater than the thickness of the dielectric structure 151 at a side of the dielectric structure 151 (e.g., the top side or the bottom side of the dielectric structure 151). As shown in FIG. 2A, the thickness of the dielectric structure 151 is gradually decreased from the center of the dielectric structure 151 to the top side or the bottom side of the dielectric structure 151.

The second spacer layer 1420 is an ultra-low-k spacer. Due to the vulnerability of ultra-low-k material, an ultra-low-k spacer may be damaged around fin and resulted in epitaxial (EPI) extrusion caused by the vulnerability of ultra-low-k material. The dielectric structure 151 is arranged to separate the second spacer layer 1420 of the spacer structure 140 form the epitaxial structure 160, thereby solving the aforementioned restrictions and building a compatible process flow (will be described in FIGS. 3A-9B) for the second spacer layer 1420 and the dielectric structure 151. The dielectric structure 151 can prevent EPI bridge to the gate stack 130 and reliability issue (e.g., time-dependent dielectric breakdown, TDDB) that are caused by EPI extrusion in a damaged corner of the spacer structure 140 with the low-k spacer.

Figure 2B:
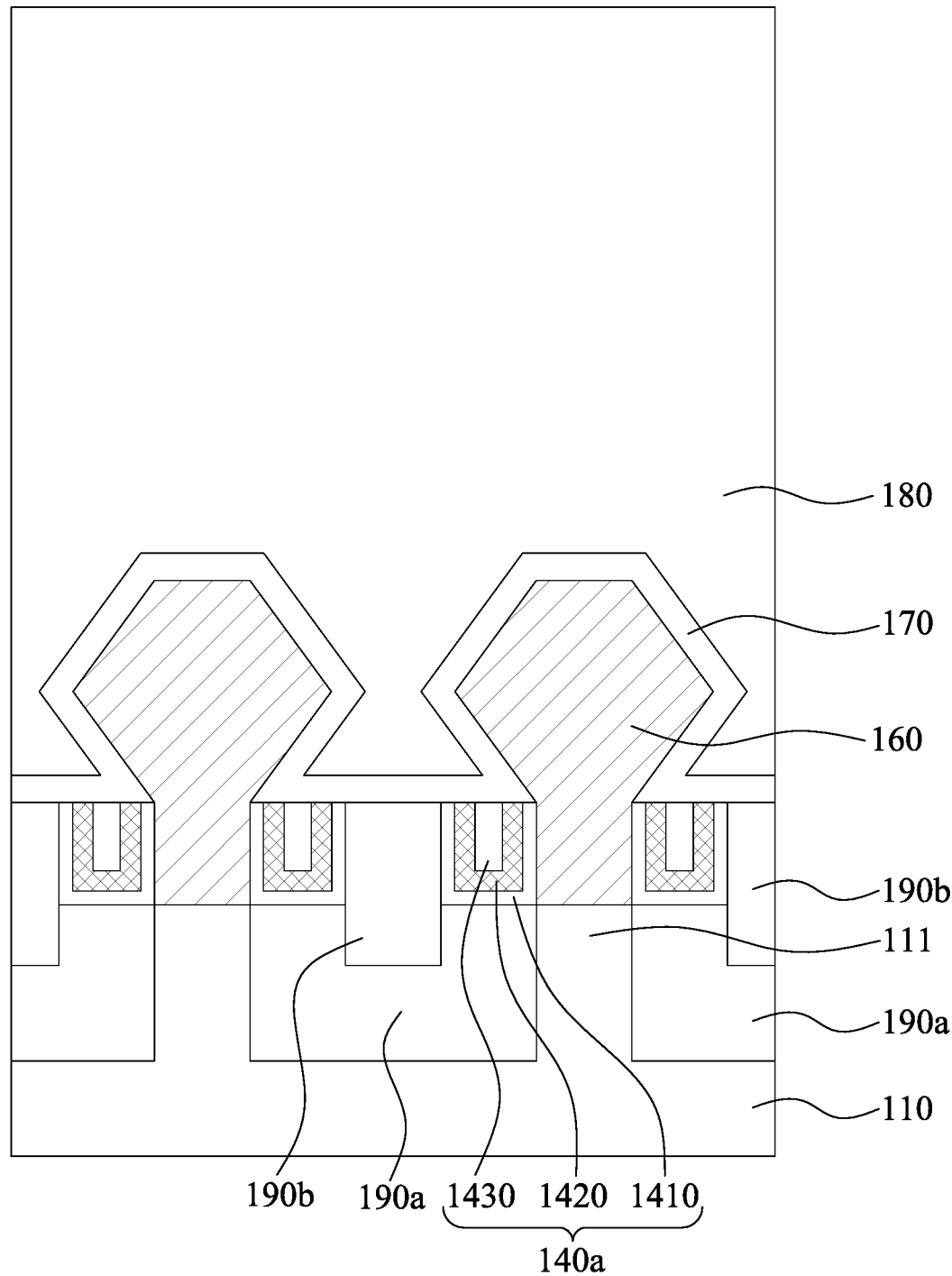
FIG. 2B is a cross-sectional view of the semiconductor device taken along line B-B of FIG. 1.

FIG. 2B is a cross-sectional view of the semiconductor device 100 taken along line B-B of FIG. 1. Reference is made to FIGS. 2A and 2B. The semiconductor device 100 further includes an etch stop layer 170 and an interlayer dielectric (ILD) 180 that are over the epitaxial structure 160. The etch stop layer 170 is between the interlayer dielectric 180 and the spacer structure 140. Moreover, the etch stop layer 170 is between the dielectric structure 151 and the interlayer dielectric 180. During annealing the interlayer dielectric 180 and planarization (e.g., CMP), the dielectric structure 151 prevents the epitaxial structure 160 form penetrating through the second spacer layer 1420 (i.e., ultra-low-k spacer) and thus EPI damage would not occur. The dielectric structure 151 serves as a protective layer for EPI growth and processes of annealing interlayer dielectric 180 and planarization (e.g., CMP). The dielectric structure 151 helps to provide a solution for a ultra-low-k sidewall (e.g., the second spacer layer 1420) and therefore better device performance, such as AC gain with ultra-low-k spacer.

In some embodiment, the semiconductor device 100 further includes a first dielectric feature 190a and a second dielectric feature 190b that are over the semiconductor substrate 110, in which a top surface of the first dielectric feature 190a is lower than a top surface of the second dielectric feature 190b. The first dielectric feature 190a may serve as a shallow trench isolation (STI). The second dielectric feature 190b is a fill fin that can tune overall fin pattern density, reinforce the mechanical strength of the device fins (i.e., the fin structures 111), and enhance the manufacturing capability. The dielectric structure 151 is above the top surface of the first dielectric feature 190a (see FIG. 1). Furthermore, another spacer structure 140a is located on the top surface of the first dielectric feature 190a, such that the spacer structure 140a is between the epitaxial structure 160 and the second dielectric feature 190b. In some embodiment, the spacer structure 140a has a top surface substantially coplanar with the top surface of the second dielectric feature 190b. The spacer structure 140a includes the first spacer layer 1410, the second spacer layer 1420, and the third spacer layer 1430 that are stacked in sequence.

In the following description, a method of forming the semiconductor device 100 will be explained.

Figure 3:
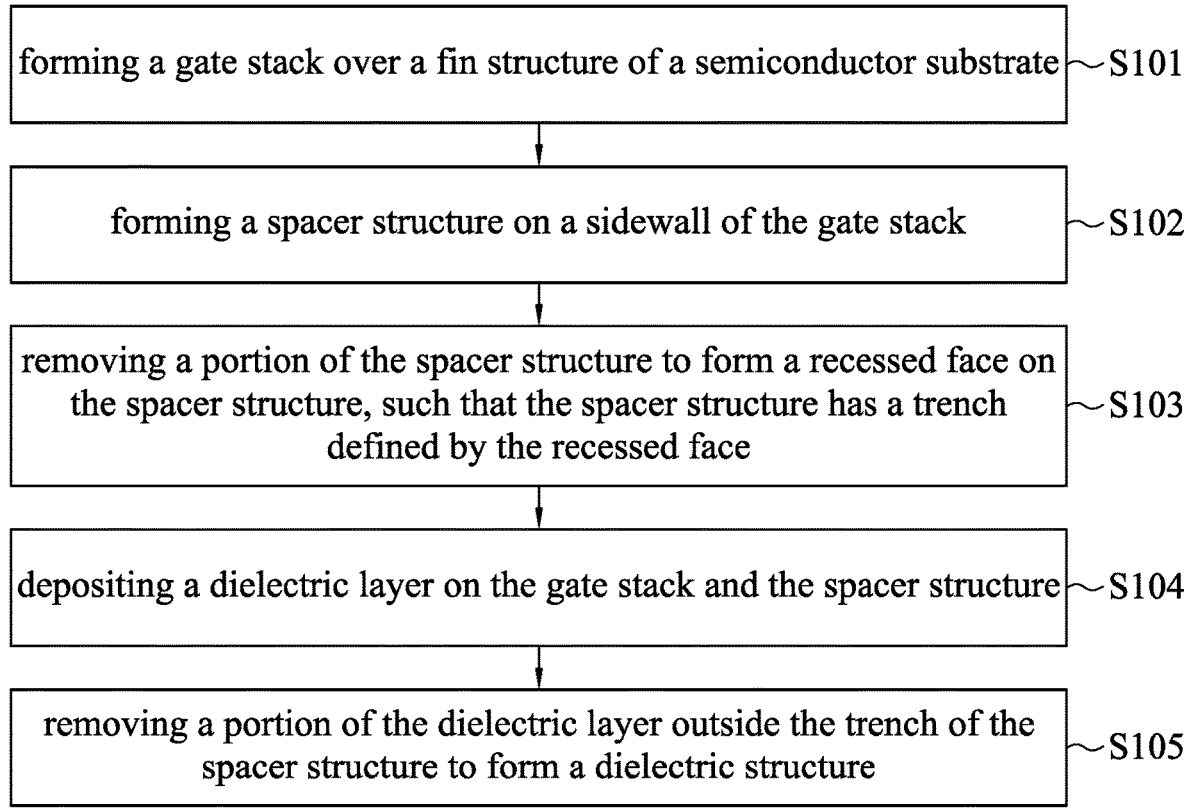
FIG. 3 is a flow chart of a method of forming a semiconductor device according to some embodiments of the present disclosure.

FIG. 3 is a flow chart of a method of forming a semiconductor device according to some embodiments of the present disclosure. The method begins with step S101 in which a gate stack is formed over a fin structure of a semiconductor substrate. The method continues with step S102 in which a spacer structure is formed on a sidewall of the gate stack. The method continues with step S103 in which a portion of the spacer structure is removed to form a recessed face on the spacer structure, such that the spacer structure has a trench defined by the recessed face. The method continues with step S104 in which a dielectric layer is deposited on the gate stack and the spacer structure. The method continues with step S105 in which a portion of the dielectric layer outside the trench of the spacer structure is removed to form a dielectric structure. While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 4A:
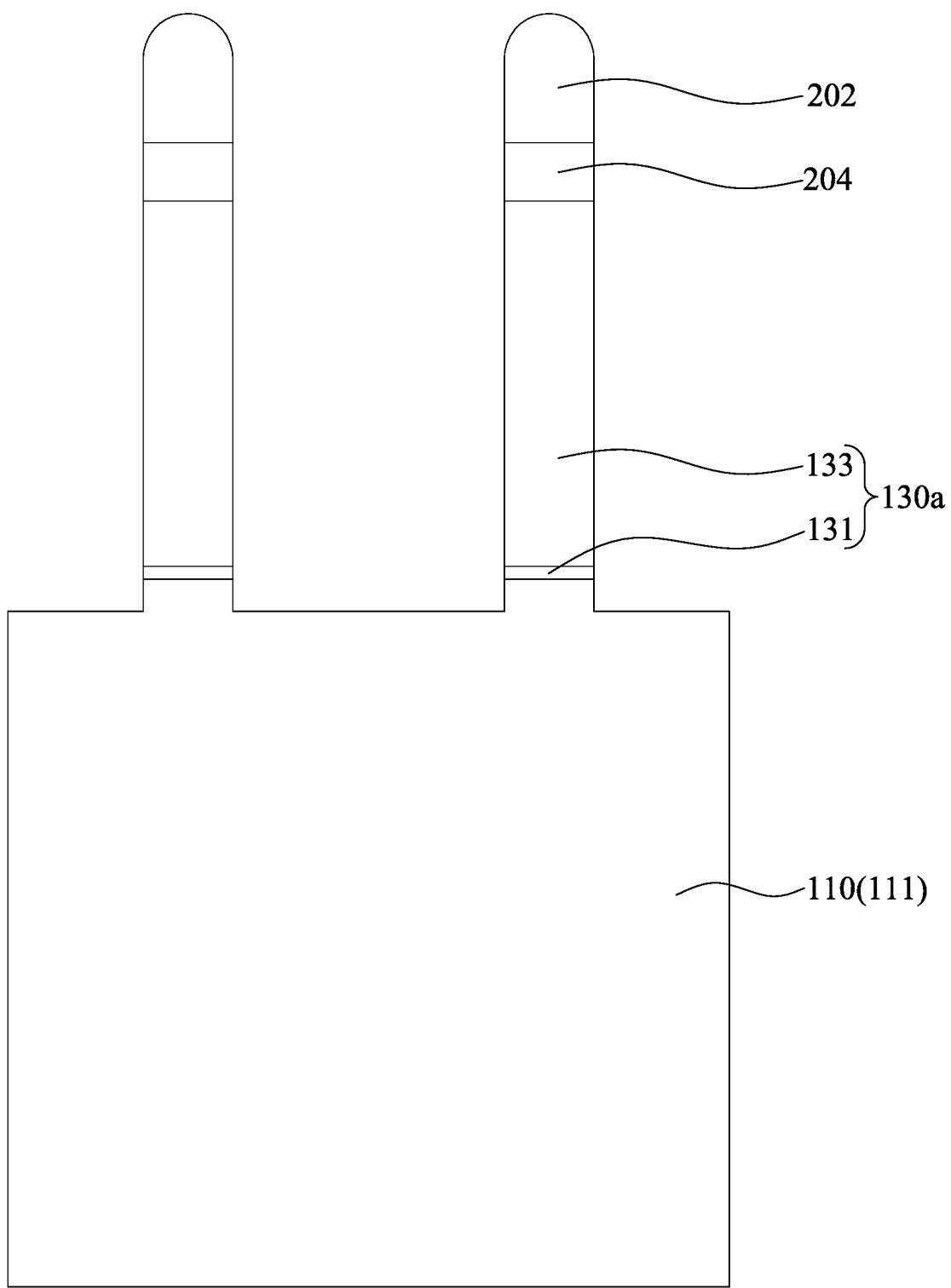
FIGS. 4A, 5A, 6A, 7A, 8A, and 9A are cross-sectional views of intermediate stages of forming the semiconductor device of FIG. 2A.
Figure 4B:
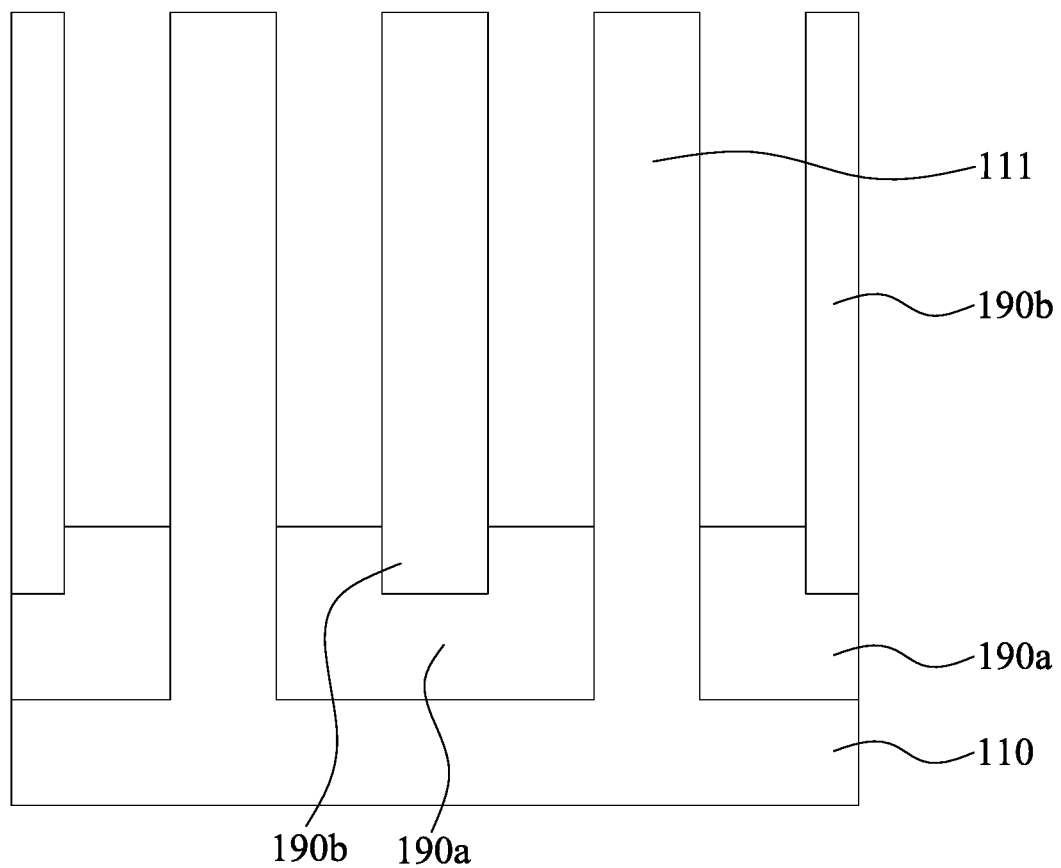
FIGS. 4B, 5B, 6B, 7B, 8B, and 9B are cross-sectional views of intermediate stages of forming the semiconductor device of FIG. 2B.

FIGS. 4A, 5A, 6A, 7A, 8A, and 9A are cross-sectional views of intermediate stages of forming the semiconductor device 100 of FIG. 2A which is taken along line A-A of FIG. 1. FIGS. 4B, 5B, 6B, 7B, 8B, and 9B are cross-sectional views of intermediate stages of forming the semiconductor device 100 of FIG. 2B which is taken along line B-B of FIG. 1. The number of the fin structures 111 in the drawings is for example, and the embodiments of the present disclosure are not limited in this regard. FIGS. 4A and 4B to FIG. 11 illustrate two fin structures 111 and other elements adjacent to the two fin structures 111. Reference is made to FIGS. 4A and 4B. The semiconductor substrate 110 is provided. The semiconductor substrate 110 is made of a semiconductor material such as silicon. The fin structure 111 is formed on the semiconductor substrate 110. The fin structure 111 may be fabricated using suitable processes including photolithography and etch processes. The photolithography process may include forming a photoresist layer over the substrate, exposing the photoresist layer to a pattern, performing post-exposure bake processes, and developing the photoresist layer to form a masking element. The masking element may then be used to protect a region of the semiconductor substrate 110 corresponding to the fin structure 111, while an etch process etches away unprotected regions, thereby forming the fin structure 111.

The first dielectric feature 190a is deposited on the semiconductor substrate 110 with a conformal profile. Suitable dielectric materials for the first dielectric feature 190a include silicon oxides, silicon nitrides, silicon carbides, fluoro-silicate glass (FSG), low-k dielectric materials, other suitable dielectric materials, or a combination thereof. The dielectric material may be deposited by any suitable technique including thermal growth, CVD, HDP-CVD, PVD, ALD, and/or spin-on techniques. In the illustrated embodiment, an ALD process is used as conformal deposition technique. In the some embodiments, the second dielectric feature 190b is deposited by atomic layer deposition (ALD) or by spin-on coating or flowable chemical vapor deposition (FCVD). The second dielectric feature 190b may be a high-k dielectric material, such as hafnium oxide ($H_fO_2$), or zirconium oxide ($Z_rO_2$). Alternatively, the second dielectric feature 190b may include carbon-containing dielectric material, such as silicon carbon oxide, silicon carbon oxynitride or silicon carbon nitride. The formation of the first and second dielectric features 190a and 190b includes sequentially forming the first and second dielectric features 190a and 190b over the semiconductor substrate 110 and across the fin structure 111, polishing (e.g., (CMP) the first and second dielectric features 190a and 190b to planarize the top surface and remove the excessive portions of the first and second dielectric features 190a and 190b above the fin structure 111, and selectively recessing the first dielectric features 190a. After the first dielectric features 190a is recessed, the fin structure 111 and the second dielectric feature 190b are extruded above the recessed first dielectric feature 190a. Any suitable etching technique may be used to recess the first dielectric features 190a, including dry etching, wet etching, RIE, and/or other etching methods. In some embodiment, an anisotropic dry etching is used to selectively remove the first dielectric features 190a without etching the fin structure 111, with a proper etching gas, such as fluorine-containing or chlorine-containing gas.

Thereafter, a gate stack 130a is formed over and across the fin structure 111 of the semiconductor substrate 110. In some embodiments, the gate stack 130a is a dummy gate stack. That is, in some embodiments using a gate-last process, the gate stack 130a is a dummy gate stack. The gate stack 130a may include the interfacial layer 131 and a dummy gate layer 133 formed over and across the fin structure 111, and the dummy gate layer 133 will be replaced by a final metal gate stack (e.g., the gate stack 130 of FIG. 2A) at a subsequent step. The interfacial layer 131 may include silicon oxide, silicon nitride, a high-k dielectric material and/or other suitable material. The dummy gate layer 133 may be made of polysilicon, amorphous silicon, any other suitable material or combinations thereof. In addition, the gate stack 130a is fabricated by layer deposition, patterning, etching, as well as other suitable processing steps.

Hard mask layers 202 and 204 may be formed on the dummy gate layer 133 and is used as an etch mask during the patterning the dummy gate layer. The hard mask layers 202 and 204 may include any suitable material, such as a silicon oxide, a silicon nitride, a silicon carbide, a silicon oxynitride, other suitable materials, and/or combinations thereof. In some embodiments, the hard mask layer 202 is made of oxide, while the hard mask layer 204 is made of silicon carbon nitride (SiCN), silicon nitride (SiN), or the like. The gate stack 130a is formed by various process steps such as layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or combinations thereof. In some embodiments, the patterning process for forming the gate stack 130s includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., reactive-ion etching (RIE) etching), wet etching, and/or other etching methods. After the gate stack 130a of FIG. 4A is formed, a portion of the fin structure 111 underlying the gate stack 130a may be referred to as the channel region.

Figure 5A:
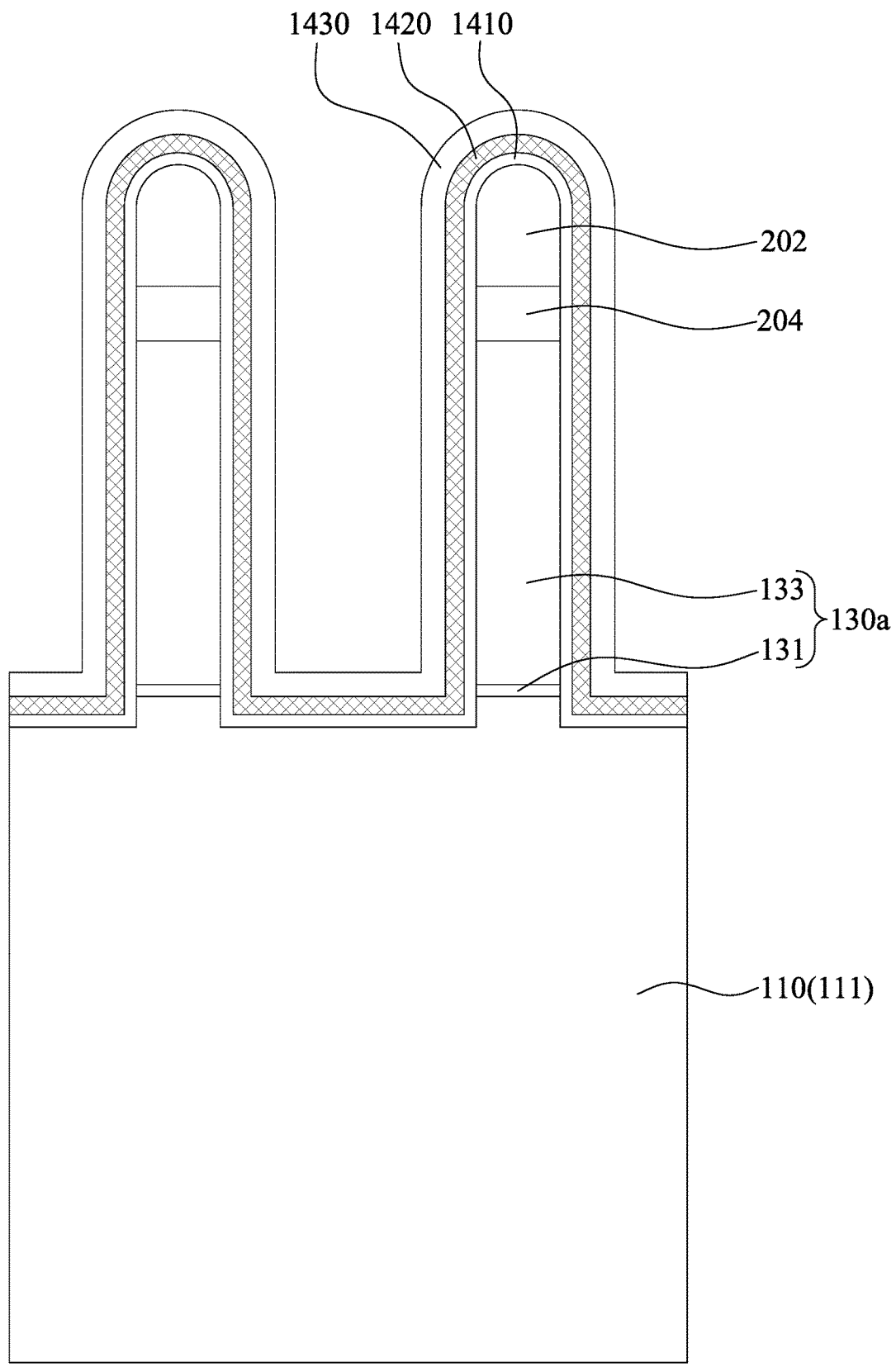
Figure 5B:
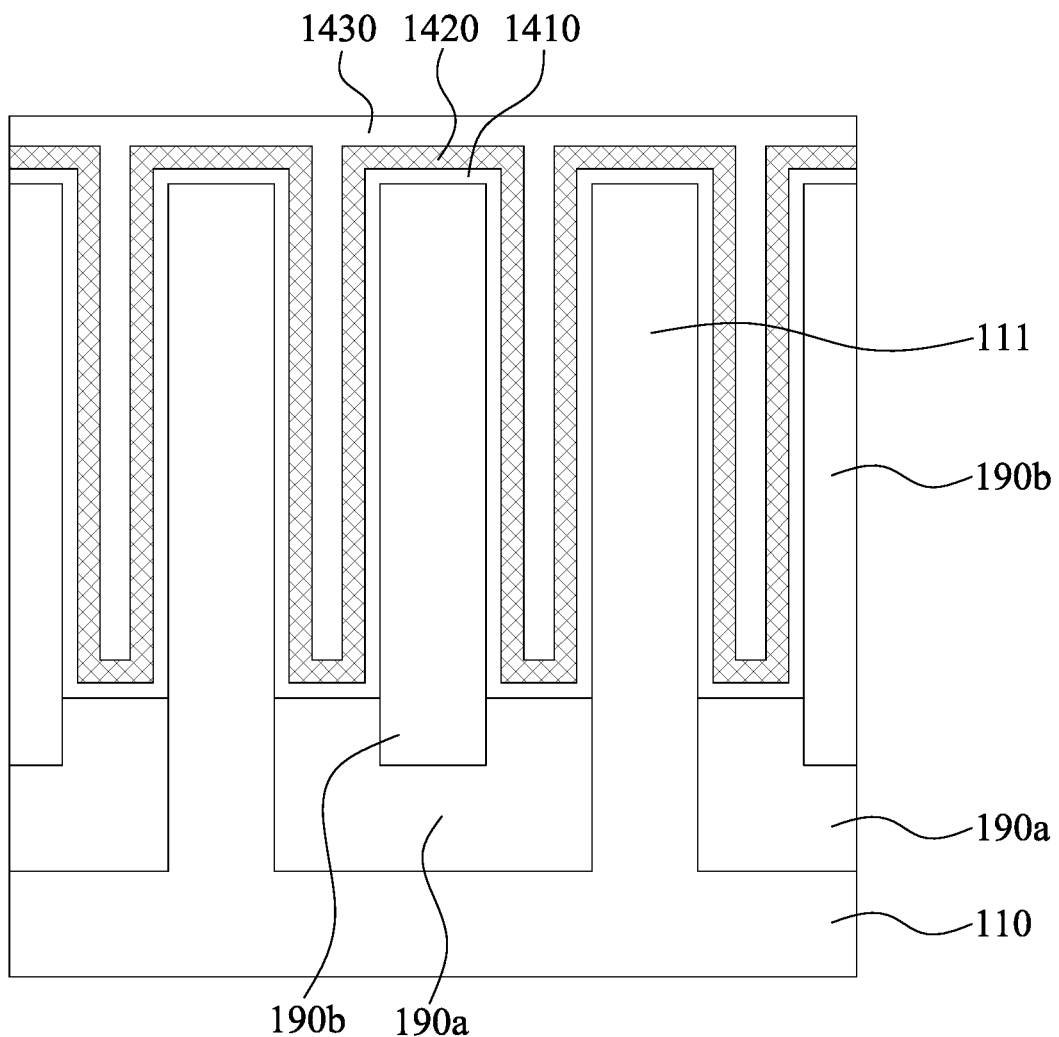

Reference is made to FIGS. 5A and 5B. The first, second, and third spacer layers 1410, 1420, and 1430 are blanket formed over the semiconductor substrate 110 in sequence. For example, the first, second, and third spacer layers 1410, 1420, and 1430 are conformally formed over the fin structure 111 and the first and second dielectric feature 190a and 190b. In some embodiments, the first, second, and third spacer layers 1410, 1420, and 1430 may be formed by depositing dielectric materials over the gate stack using processes such as a CVD process, a SACVD process, a flowable CVD process, an ALD process, a PVD process, or other suitable processes.

Figure 6A:
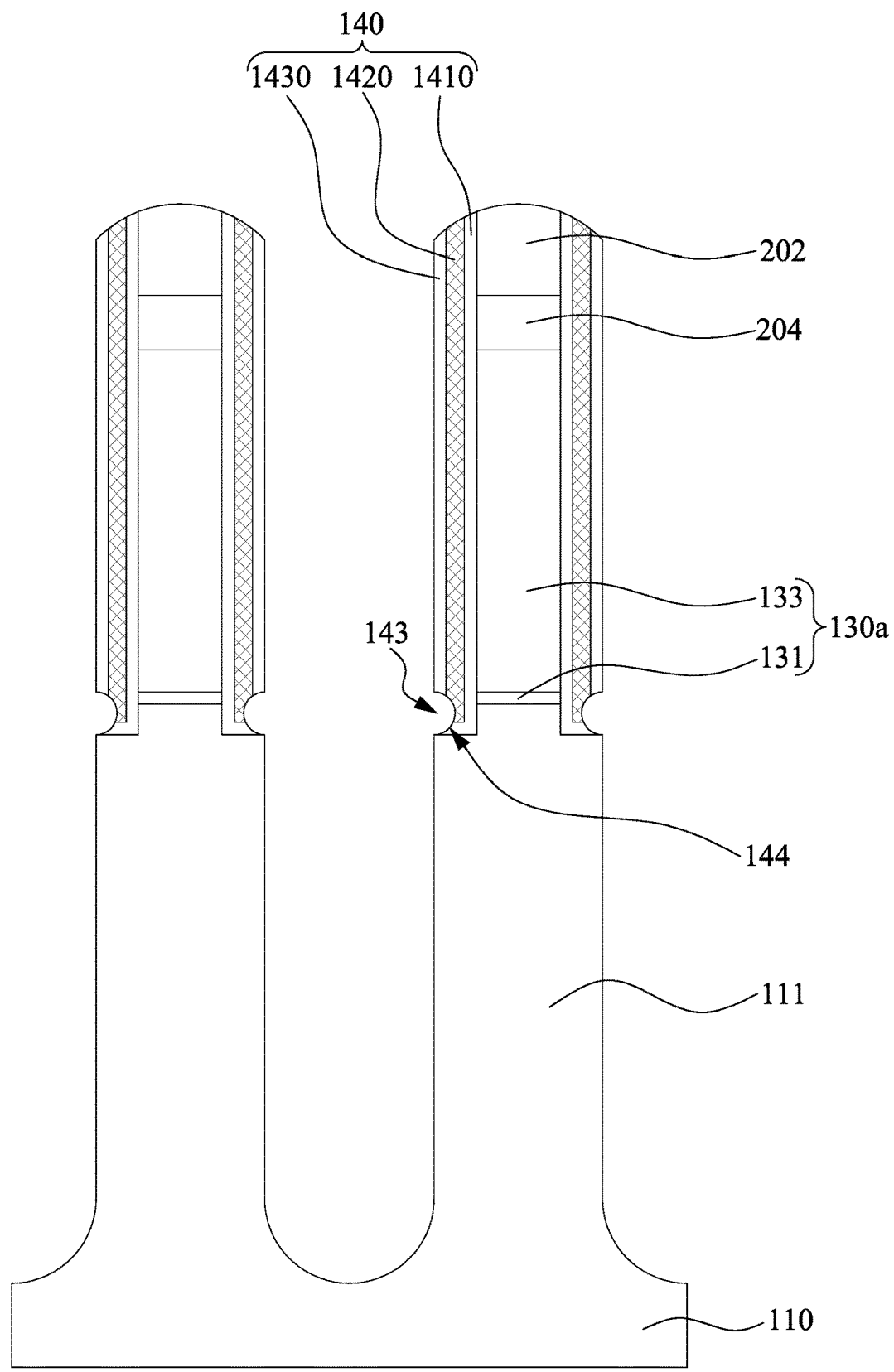
Figure 6B:
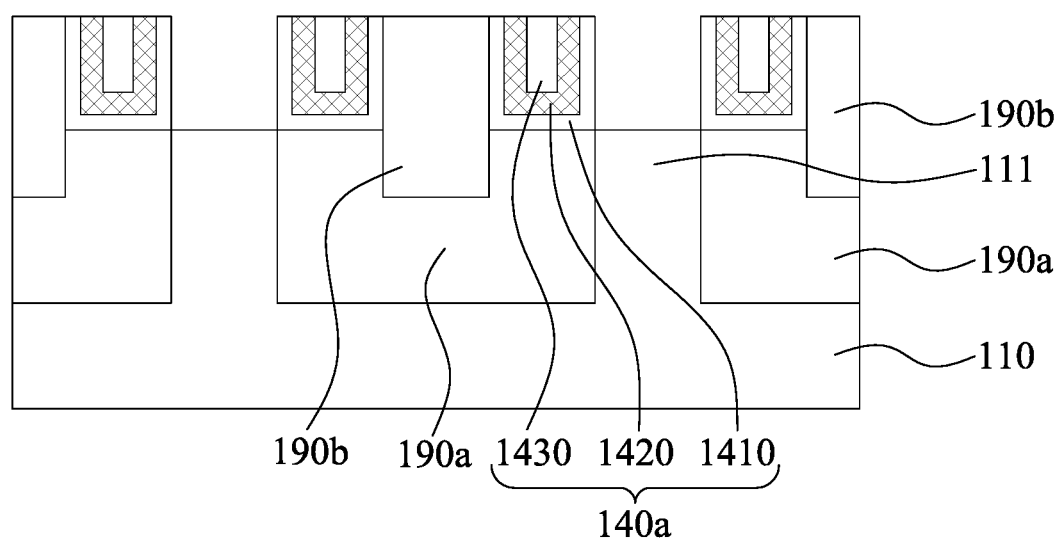

Reference is made to FIGS. 6A and 6B. Thereafter, the first, second, and third spacer layers 1410, 1420, and 1430 are then patterned to form the spacer structure 140 and 140a. The spacer structure 140 is formed on a sidewall of the gate stack 130a, while the spacer structure 140a is formed on the top surface of the first dielectric feature 190a. In some embodiments, the first, second, and third spacer layers 1410, 1420, and 1430 may be etched by SSD plasma etch by CxFy, CHx, CHxFy, F-based, HBr gas, or combinations thereof. After the formation of the first, second, and third spacer layers 1410, 1420, and 1430, the first, second, and third spacer layers 1410, 1420, and 1430 may be etched-back to expose portions of the fin structure 111 adjacent to and not covered by the gate stack 130 (e.g., source/drain regions). In some embodiments, the etching-back process of the spacer layers may include a wet etch process, a dry etch process, a multiple-step etch process, and/or a combination thereof. Specifically, the etching-back process can be anisotropic, such that portions of the spacer layers substantially parallel to the sidewall of the gate stack 130a remain, and portions of the spacer layers on a top face of the fin structure 111, portions of the spacer layers on sidewalls of the fin structure 111, and portions of the spacer layers on a top face of the gate stack 130 are removed. As a result, the first spacer layer 1410 is formed on the gate stack 130a. The second spacer layer 1420 is formed on the first spacer layer 1410. The third spacer layer 1430 is formed on the second spacer layer 1420.

The first spacer layer 1410 is a low-k spacer, and can be made of a material such as silicon oxycarbonitride (SiOCN), silicon oxycarbide (SiOC), silicon carbon nitride (SiCN), silicon nitride (SiN), or the like. The second spacer layer 1420 is an ultra-low-k spacer. The third spacer layer 1430 is a low-k spacer, and can be made of a material such as silicon carbon nitride (SiCN), silicon nitride (SiN), or the like. In other words, the dielectric constant of the second spacer layer 1420 is lower than the dielectric constants of the first spacer layer 1410 and the third spacer layer 1430. In some embodiments, the first spacer layer 1410, the second spacer layer 1420, and the third spacer layer 1430 may be made of different materials.

In addition, the fin recess 112 may be formed in the fin structure 111. Specifically, a portion of the fin structure 111 adjacent to the spacer structure 140 is etched and recessed, such that the fin recess 112 is formed. During the recessing, the etching process may etch away a portion of the spacer structure 140 at the lower portion of the sidewall of the spacer structure 140. The portion of the spacer structure 140 is removed to form the recessed face 144 on the sidewall of the spacer structure. In other words, the spacer structure 140 has a trench 143 defined by the recessed face 144.

Figure 7A:
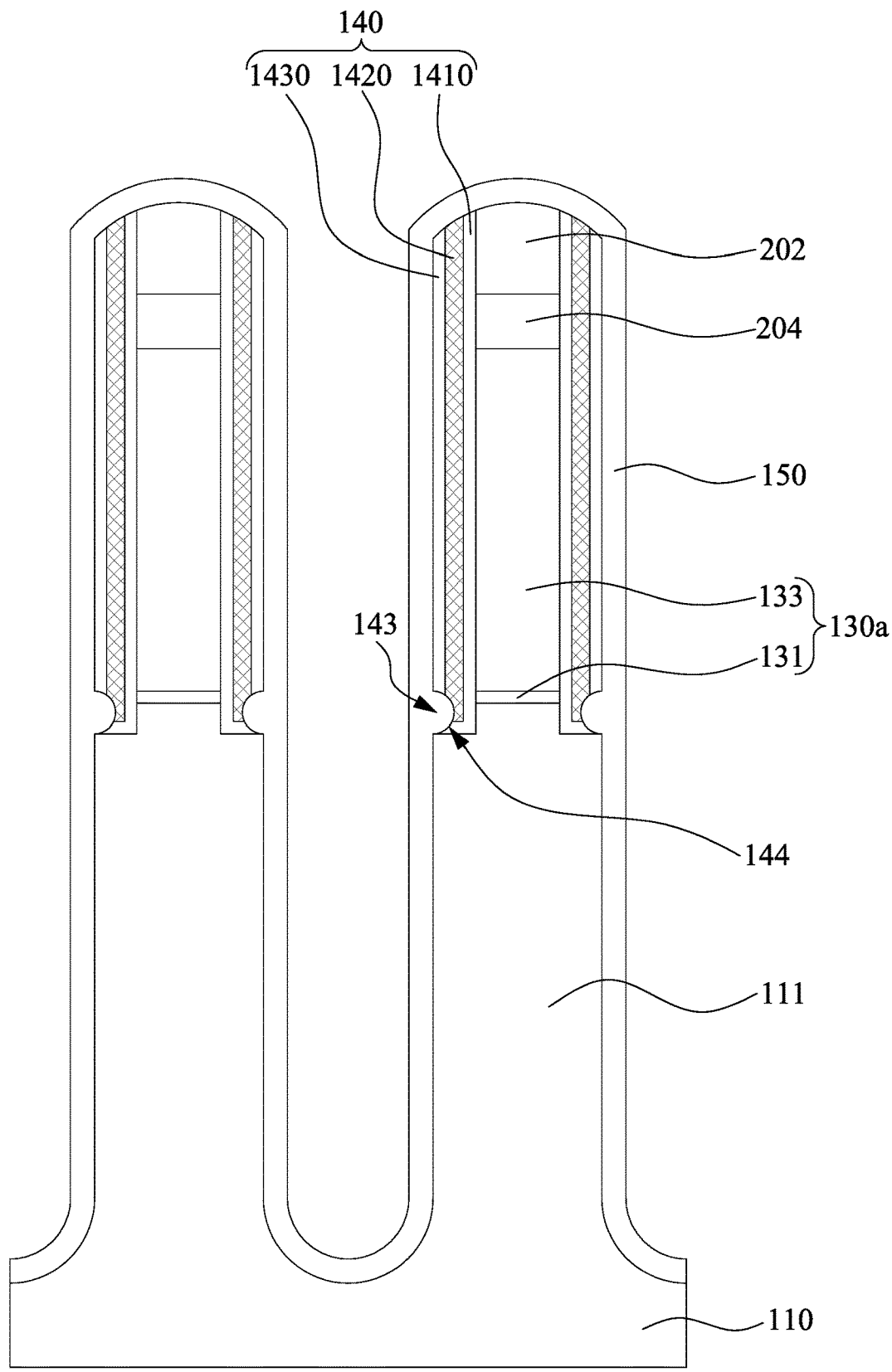
Figure 7B:
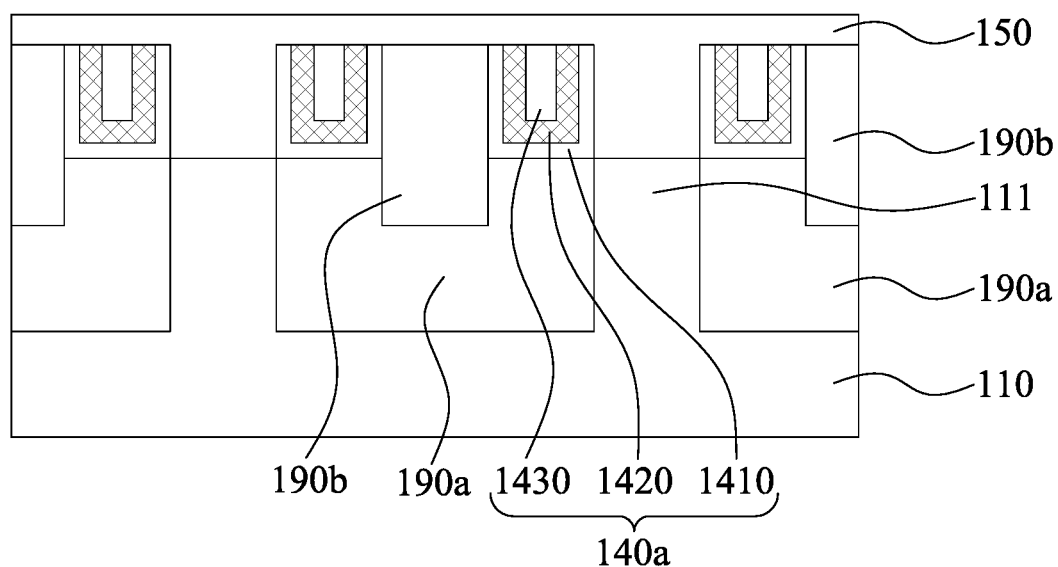

Reference is made to FIGS. 7A and 7B, a dielectric layer 150 is disposed over the semiconductor device 100. Specifically, the dielectric layer 150 is disposed over the spacer structure 140, the gate stack 130a, the fin recess 112, the spacer structure 140a, and the second dielectric feature 190b. During the formation of the dielectric layer 150, the trench 143 of the spacer structure 140 of FIG. 6A is filled with the dielectric layer 150, and the dielectric layer 150 is deposited on the recessed face 144 of the spacer structure 140. In some embodiments, the dielectric layer 150 may be formed by depositing a dielectric material over the gate stack using processes such as a CVD process, a SACVD process, a flowable CVD process, an ALD process, a PVD process, or other suitable processes.

Figure 8A:
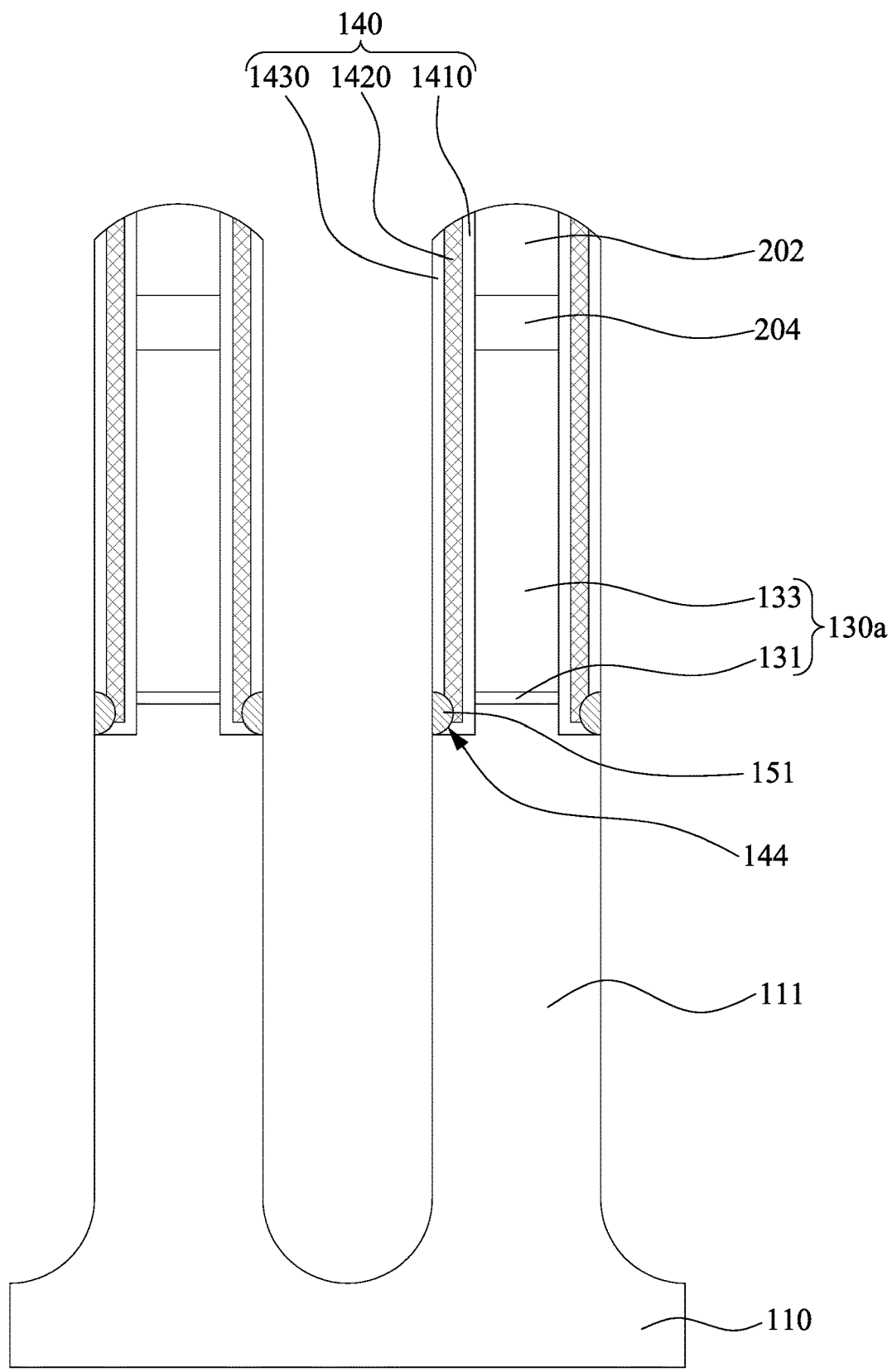
Figure 8B:
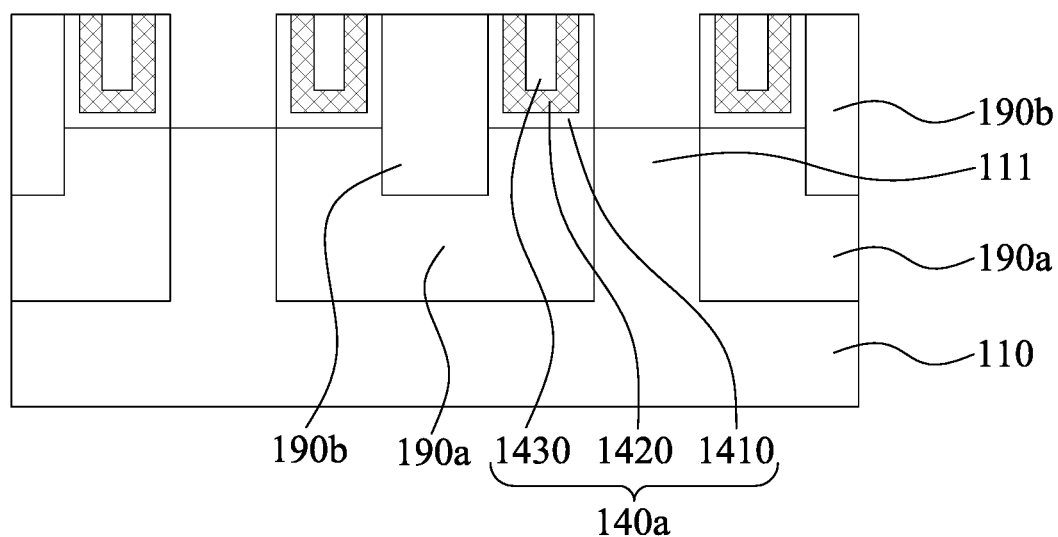

Reference is made to FIGS. 8A and 8B, the dielectric layer 150 is etched to remove portions of the dielectric layer 150 outside the trench 143 (see FIG. 6A) in the sidewall of the spacer structure 140, thereby forming the dielectric structure 151. Specifically, portions of the dielectric layer 150 outside the trench 143 surrounded by the recessed face 144 are etched away. Therefore, the dielectric structure 151 remains on the recessed face 144 of the spacer structure 140, and is in contact with the recessed face 144 of the spacer structure 140. In some embodiments, the dielectric structure 151 is formed by isotropic etch or ion-bombard etch. In some embodiments, HFx, Fx, F-based, H2, NHx, NFx, or combinations thereof may be used in the isotropic etch. The dielectric structure 151 act as a corner spacer with the thickness of about 2 nm to about 5 nm to effectively protect the gate stack 130 of FIGS. 1 and 2A.

The semiconductor substrate 110 may include at least one N region and at least one P region. The dielectric layer 150 is formed over the N region and the P region. In some embodiments, portions of the dielectric layer 150 over the N region are then etched to form the dielectric structure 151 of FIGS. 8A and 8B, while the other portions of the dielectric layer 150 over the P region remains.

Figure 9A:
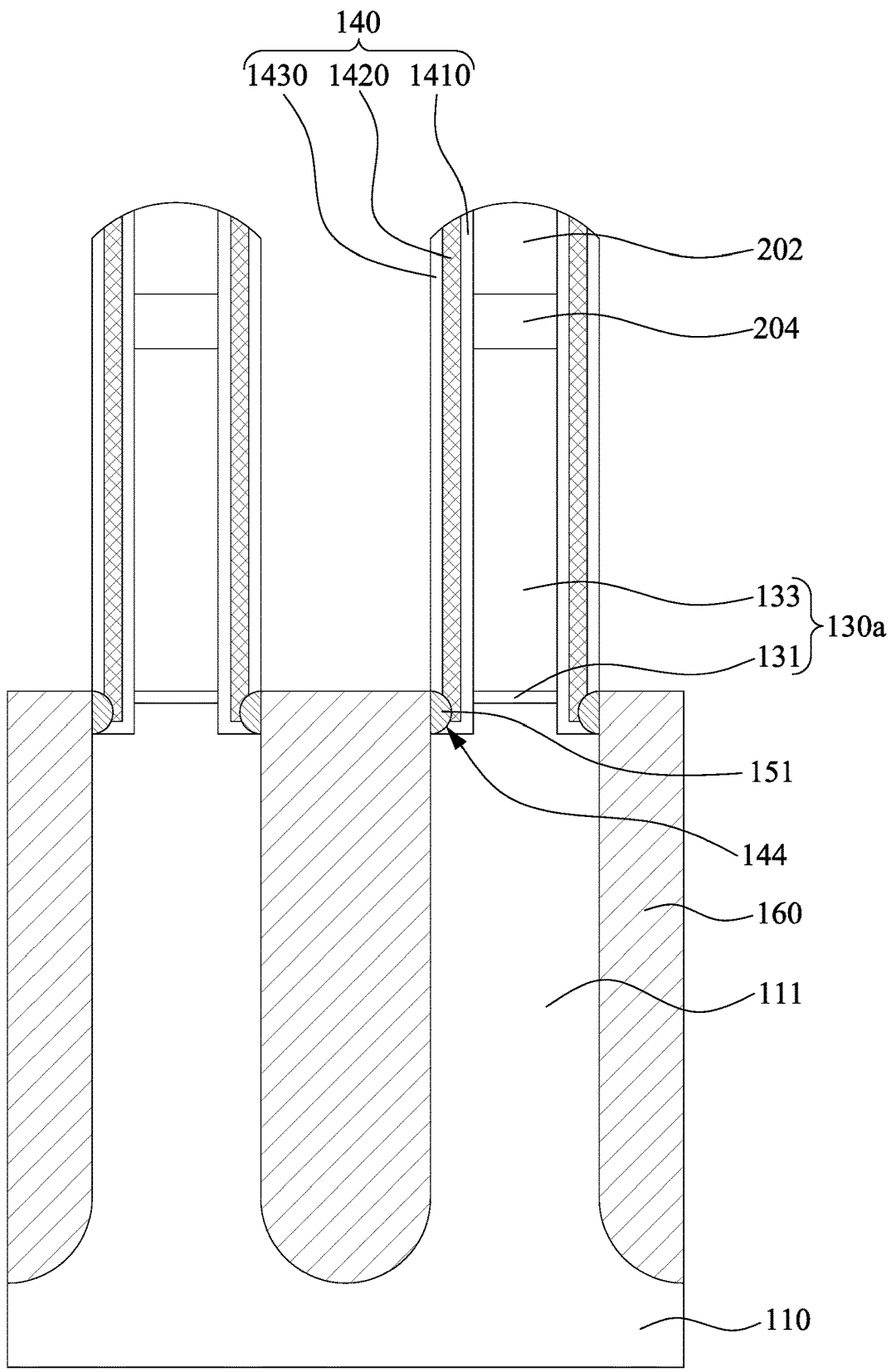
Figure 9B:
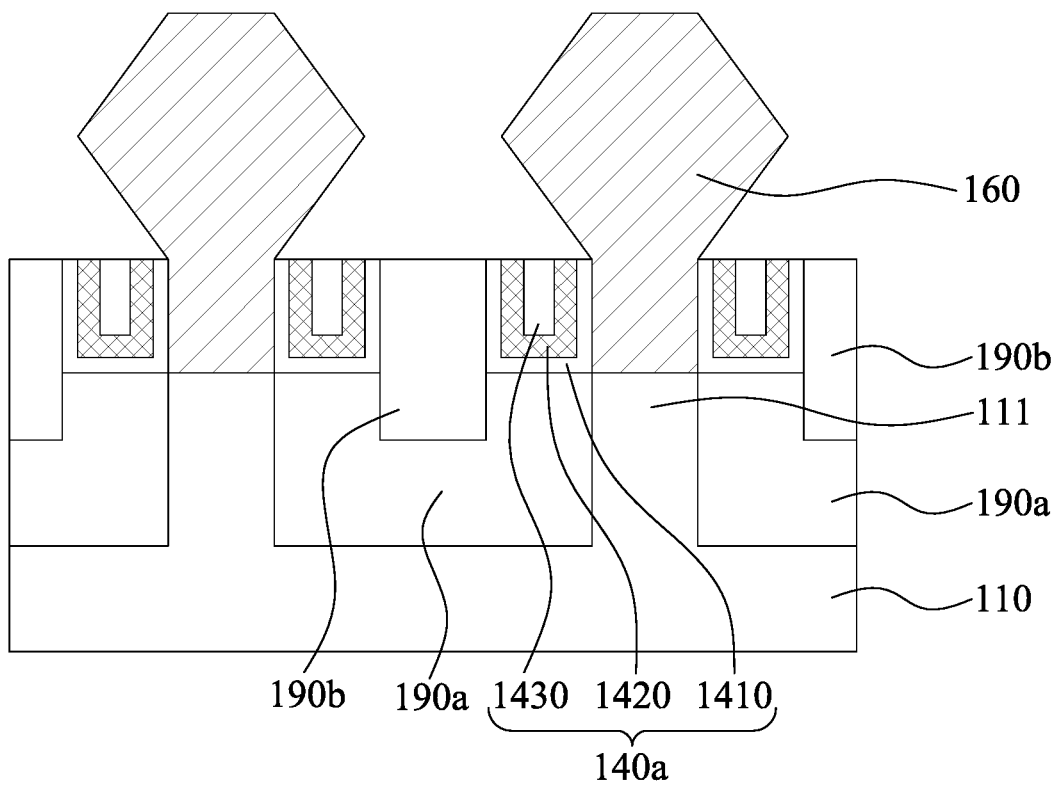

Reference is made to FIGS. 9A and 9B, the epitaxial structure 160 is formed to protrude from the fin recess 112. In some embodiments, the epitaxial structure 160 covers the dielectric structure 151, and is in contact with the dielectric structure 151. The epitaxial structure 160 may be grown at the fin recess 112 which is adjacent to the channel region. In some embodiments, the epitaxial structure 160 is an N-type epitaxial structure, and may include epitaxially growing silicon phosphorus (SiP), silicon carbon (SiC), or other suitable material. In some embodiments, the epitaxial structure 160 may be in-situ doped during the epitaxial growth process. For example, in some embodiments, epitaxially grown material may be doped with boron. In some embodiments, epitaxially grown material may be doped with carbon to form SiC source/drain structures, phosphorous to form SiP source/drain structures, or both carbon and phosphorous to form SiCP source/drain structures. In some embodiments, the epitaxial structure 160 is not in-situ doped. In such some embodiments, an implantation process is performed to dope the epitaxial structure 160. The formation of the epitaxial structure 160 over the P region is similar to that of the epitaxial structure 160 over the N region. After the N-type epitaxial structure 160 is formed, the remaining portions of the dielectric layer 150 shown in FIGS. 7A and 7B over the P region are etched to form the dielectric structure 151 shown in FIGS. 8A and 8B, and an P-type epitaxial structure 160 shown in FIGS. 9A and 9B is then grown at the fin recess 112. In some embodiments, the P-type epitaxial structure 160 may include an epitaxially growing silicon germanium (SiGe) or other suitable material.

Referring back to FIGS. 2A and 2B, after the semiconductor structure show in FIGS. 9A and 9B is formed, an etch stop layer 170 is formed over the epitaxial structure 160, and an interlayer dielectric 180 is formed over the etch stop layer 170. The etch stop layer 170 serves as a bottom contact etch stop layer (BCESL), and contacts the third spacer layer 1430 of the spacer structure 140. Thereafter, the dummy gate stack 130a of FIG. 9A is removed, and the dummy gate layer 133 is replaced with the (metal) gate stack 130 of FIG. 2A including the gate dielectric 132, the work function layer 134, and the gate electrode 136. The gate dielectric 132 is formed over a portion of the fin structure 111 between the spacer structures 140. The work function layer 134 is formed over the gate dielectric 132. The gate electrode 136 is formed over the work function layer 134. In some embodiments, the gate dielectric 132 includes a high-k dielectric material, and the gate electrode 136 includes metal or metal alloy. The high-k dielectric material may include metal oxide, metal nitride, such as LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable dielectric materials. The high-k dielectric 132 is deposited using a suitable technique, such as ALD, CVD, metal-organic CVD (MOCVD), PVD, thermal oxidation, and/or other suitable techniques. The work function layer 134 may be deposited by a suitable technique, such as PVD. The work function layer 134 includes tantalum, tantalum nitride, nickel silicide, cobalt silicide, TiN, WN, TiAl, TiAlN, TaCN, TaC, TaSiN, other suitable material, or combinations thereof. The gate electrode 136 formed on the work function layer 134 includes a suitable conductive material, such as aluminum, tungsten, or copper. The gate electrode 136 may additionally or collectively include polysilicon, titanium, tantulum, metal alloys, other suitable materials, and/or combinations thereof. Subsequent to the formation of the gate stack 130, a chemical-mechanical planarization (CMP) process may be performed to provide a substantially coplanar surface of the gate stack 130, the spacer structure 140, and the interlayer dielectric 180. As a result, the semiconductor device 100 show in FIGS. 1, 2A, and 2B can be obtained.

Figure 10A:
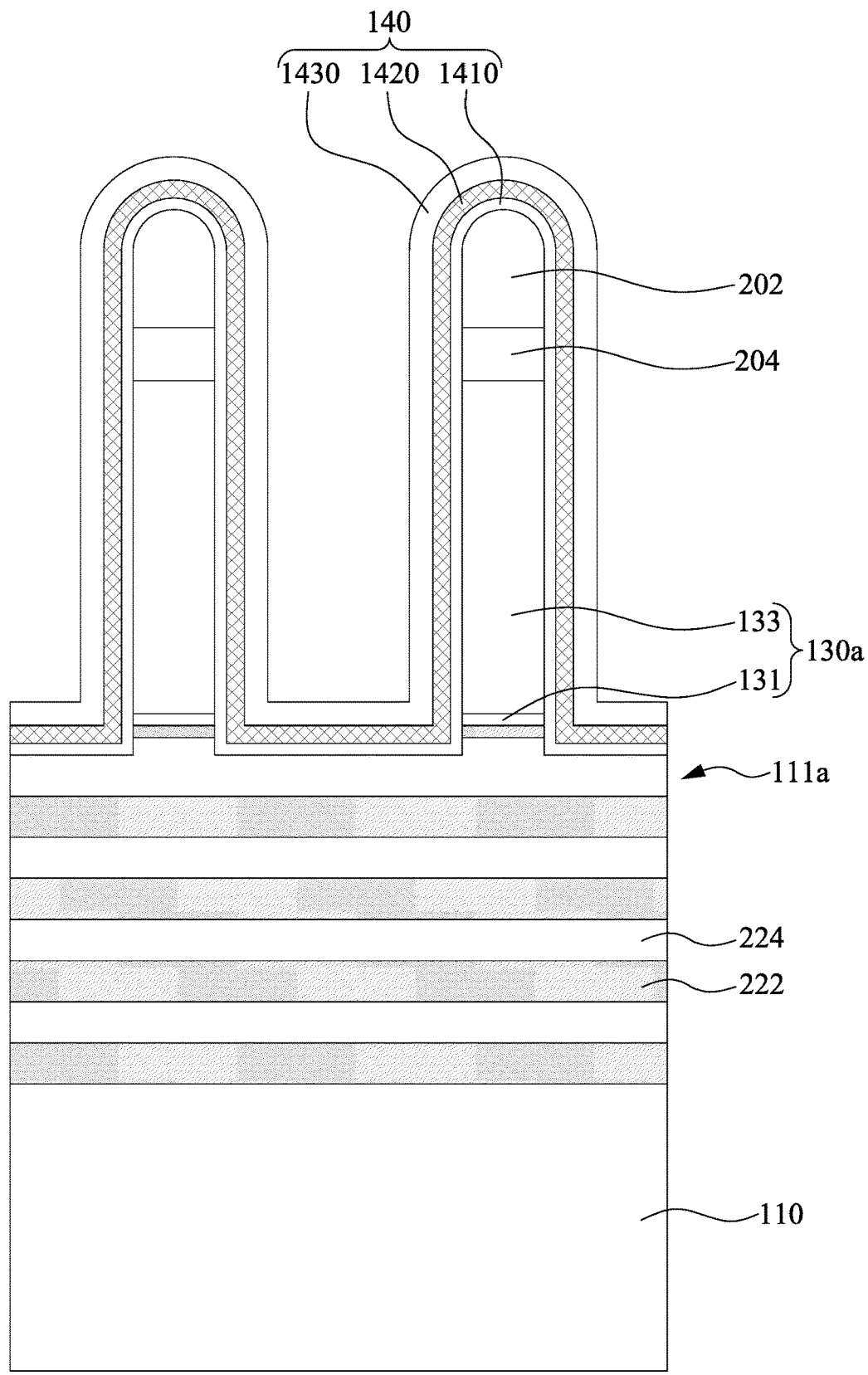
FIGS. 10A and 10B are cross-sectional views of a semiconductor structure according to some embodiments different from FIGS. 4A and 4B.
Figure 10B:
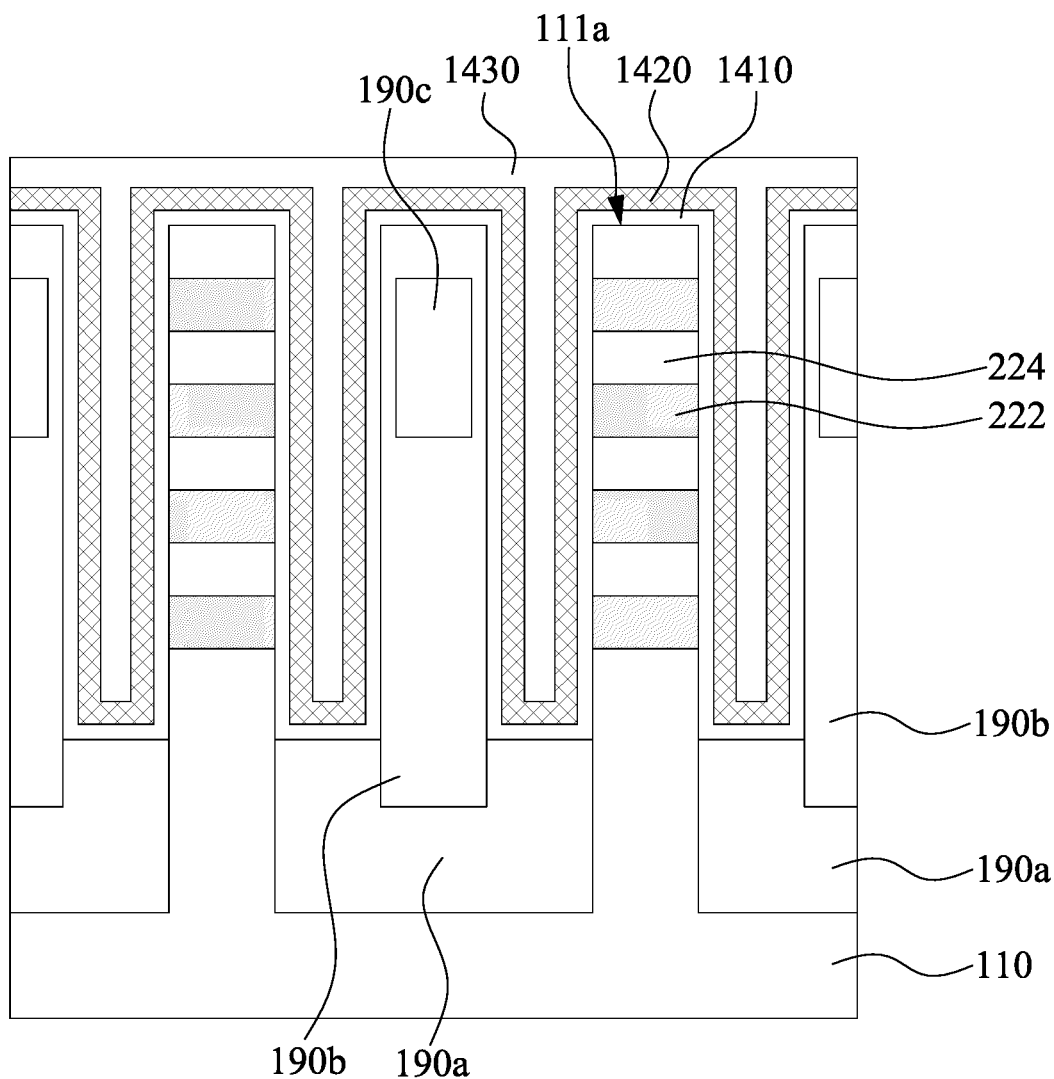

FIGS. 10A and 10B are cross-sectional views of a semiconductor structure according to some embodiments different from FIGS. 4A and 4B. In alternative embodiments, the semiconductor structure of FIG. 10A or 10B includes a fin structure 111a is an epitaxial stack over the semiconductor substrate 110. The fin structure 111a includes first nanosheets 222 (or nanowires 222) of a first composition and second nanosheets 224 (or nanowires 224) of a second composition alternatively disposed with the first nanosheets 222. The first and second compositions may be different or may be the same. In some embodiments, the first nanosheets 222 are made of SiGe, and the second nanosheets 224 are made of silicon, but not limited thereto. In some embodiments, a top-most nanosheet of the fin structure 111a is the second nanosheet 224. The epitaxial stack 220 may include 4-8 pairs of the first and second nanosheets 222 and 224, but embodiments of the present disclosure are not limited in this regard. The formation of the fin structure 111a includes forming the first and second nanosheets 222 and 224 alternatively over the semiconductor substrate 110, and patterning the first and second nanosheets 222 and 224 to form trenches and the fin structure 111a.

In some embodiments, as show in FIG. 10B, a third dielectric feature 190c is disposed in and surrounded by the second dielectric feature 190b. The second and third dielectric features 190b and 190c combines to form a fill fin that can tune overall fin pattern density, reinforce the mechanical strength of the device fins (i.e., the fin structures 111a), and enhance the manufacturing capability. In some embodiments, the third dielectric feature 190c may be made of SiOCN, SiOC, SiCN, MeOX, or the like.

Figure 11:
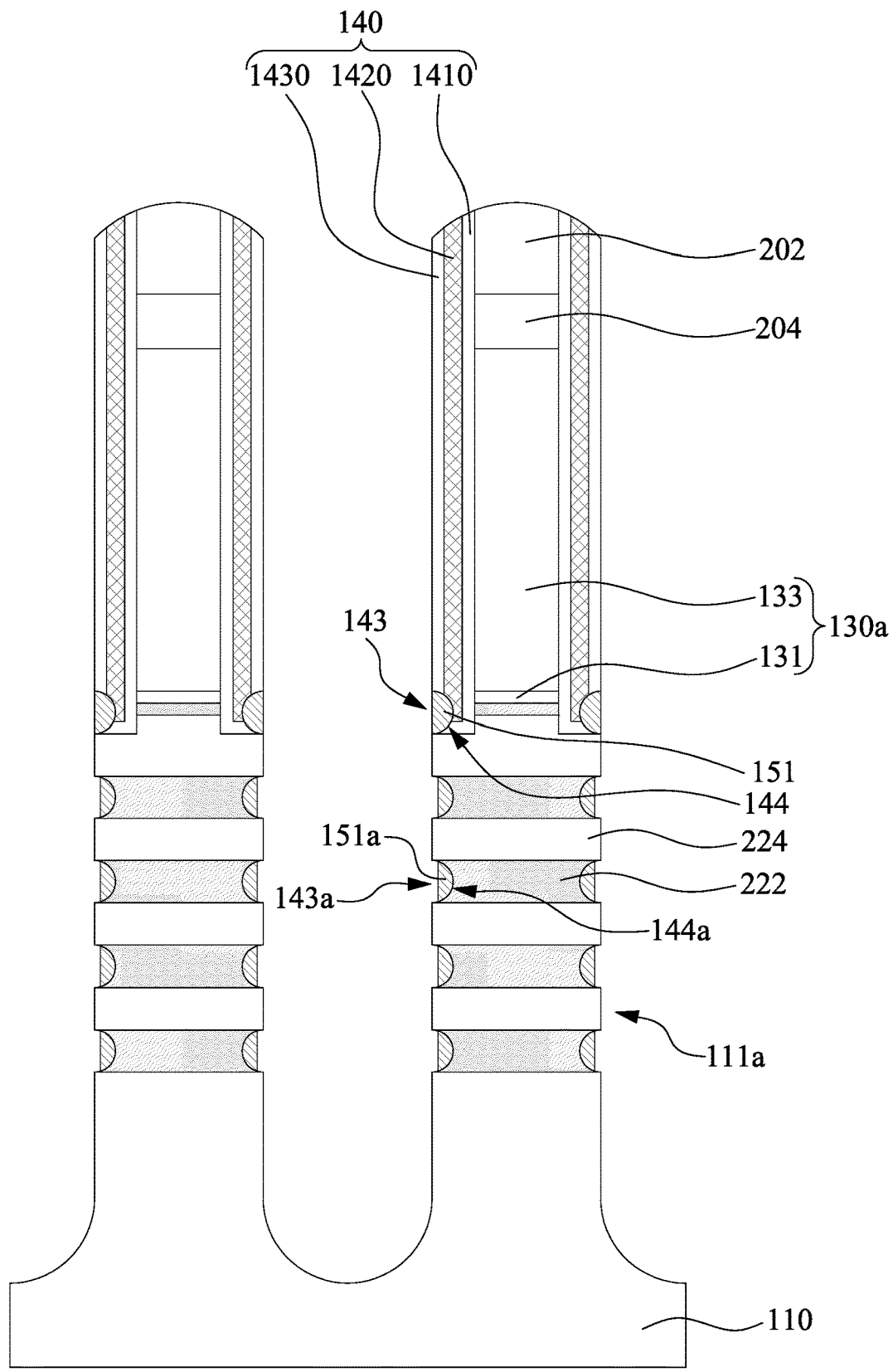
FIG. 11 is a cross-sectional view of a semiconductor structure according to some embodiments different from FIG. 7A.

FIG. 11 is a cross-sectional view of a semiconductor structure according to some embodiments different from FIG. 7A. The manufacturing steps from FIG. 10A to FIG. 11 include the manufacturing steps form FIG. 4A to FIG. 6A, and will not be described again. However, when the fin recess 112 is formed in the fin structure 111a, etching process etch away the lower portion of the spacer structure 140, and further etch away portions of the first and second nanosheets 222 and 224. Therefore, the portions of the first and second nanosheets 222 and 224 are removed to form recessed faces 144a on sidewalls of the fin structure 111a. The recessed face 144a is defined by the first and second nanosheets 222 and 224. As a result, the fin structure 111a has trenches 143a defined by the recessed faces 144a. Afterwards, the dielectric layer 150 (see FIG. 7A) can be formed on the sidewall of the fin structure 111a. Accordingly, the dielectric layer 150 is further deposited on the recessed face 144a of the fin structure 111a to fill into the trenches 143a. After the structure layer 150 is etched to remove portions of the dielectric layer 150 outside the trench 143a in the sidewall of the spacer structure 140, thereby forming a dielectric structure 151a. Specifically, portions of the dielectric layer 150 outside the trenches 143a surrounded by the recessed faces 144a are etched away. Therefore, the remaining dielectric structures 151a are respectively formed in the trenches 143a, and are respectively in contact with the recessed faces 144a of the fin structure 111a.

In some embodiments, one of the first and second nanosheets 222 and 224 may have a thickness in a range from about 4 nm to about 10 nm, such that the fin structure 111a may have a height in a range from about 40 nm to about 70 nm. If the second nanosheet 224 is less than 4 nm, the area of the channel region will be too small and the resistance will be too high, thereby affecting electrical property. If the second nanosheet 224 is greater than 10 nm, the capability of controlling gate will be too bad, thereby affecting electrical property. If the first nanosheet 222 is less than 4 nm, a (metal) gate stack 130 (see FIG. 12) will be difficult to fill in a space between two adjacent second nanosheets 224 to cause wrong function. If the first nanosheet 222 is greater than 10 nm, the thickness of the dielectric structure 151a is increased. However, the thickness of the dielectric structure 151a is limited to poly to poly space (e.g., space between two adjacent dummy gate layers 133).

Figure 12:
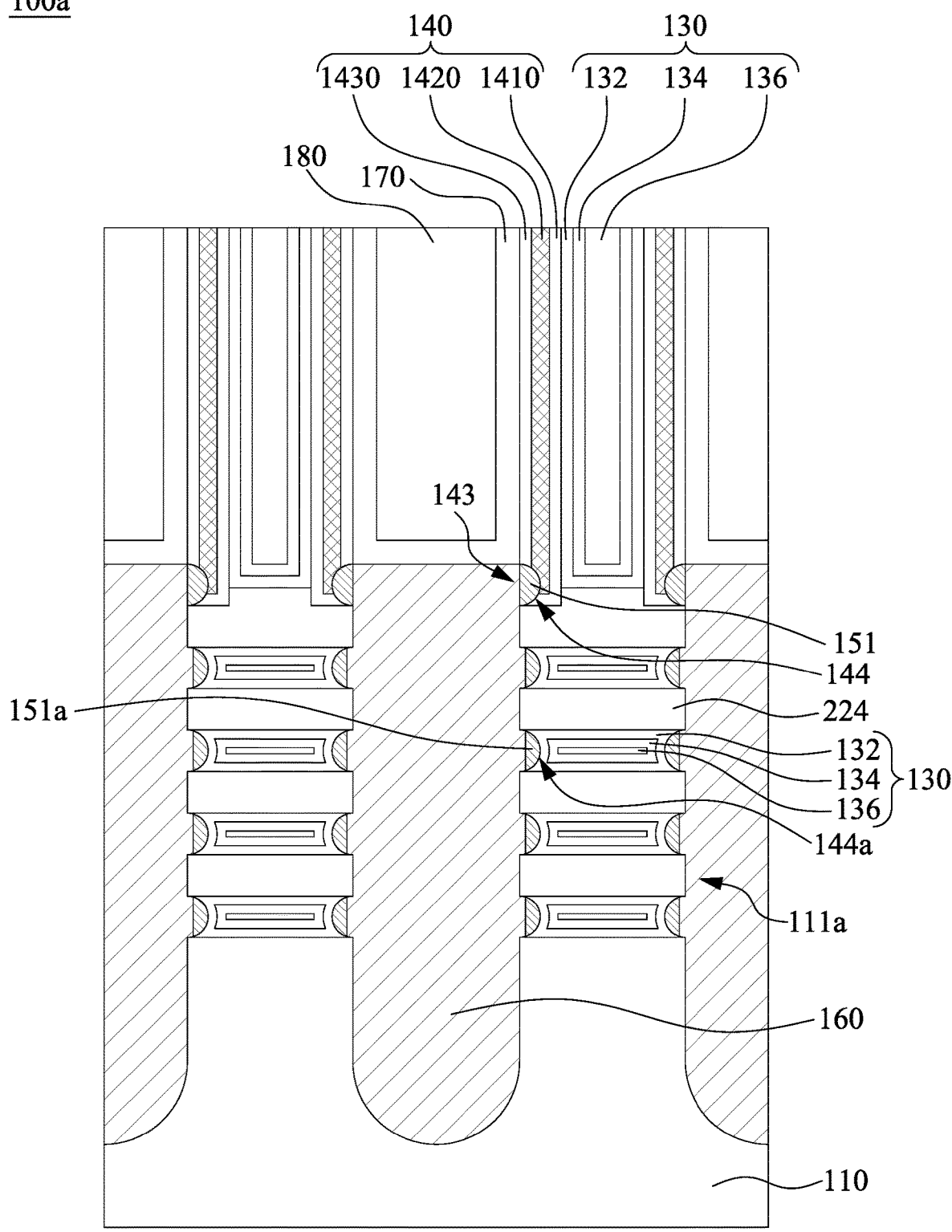
FIG. 12 is a cross-sectional view of a semiconductor device according to some embodiments of the present disclosure.

FIG. 12 is a cross-sectional view of a semiconductor device 100a according to some embodiments of the present disclosure. As shown in FIG. 11 and FIG. 12, after the dielectric structures 151 and 151a is formed, several steps are similar to the aforementioned steps including forming the epitaxial structure 160 over the fin recess 112, forming the etch stop layer 170 over the epitaxial structure 160, forming the interlayer dielectric 180 over the etch stop layer 170, and replacing the dummy gate stack 130a and the first nanosheet 222 with the (metal) gate stack 130. As a result, a gate all around (GAA) semiconductor device 100a of FIG. 12 can be obtained. In some embodiments, the dielectric structures 151 and 151a are in contact with the epitaxial structure 160.

In the aforementioned semiconductor device, the semiconductor device includes the dielectric structure in the spacer structure and extending along the lower portion of the spacer structure and across the fin structure, and thus at least one ultra-low-k spacer of the spacer structure and the epitaxial structure can be separated by the dielectric structure. Accordingly, the ultra-low-k spacer would not be damaged around the fin structure, and the issue about epitaxial (EPI) extrusion can be solved. The dielectric structure can prevent EPI bridge to the gate stack and reliability issue (e.g., time-dependent dielectric breakdown, TDDB) caused by EPI extrusion in a damaged corner of a low-k spacer.

According to some embodiments of the present disclosure, a semiconductor device includes a semiconductor substrate having a fin structure, a gate stack across the fin structure, a spacer structure on a sidewall of the gate stack, an epitaxial structure on the semiconductor substrate, and a dielectric structure in the spacer structure and extending along a lower portion of the spacer structure and across the fin structure.

According to some embodiments of the present disclosure, a semiconductor device includes a semiconductor substrate having a fin structure, a gate stack over the fin structure, a spacer structure over the fin structure and on a sidewall of the gate stack, and a dielectric structure. The spacer structure has a recessed face with a curved shape at a position proximal to the fin structure. The dielectric structure in the spacer structure and has an inner face conformal to the recessed face of the spacer structure.

According to some embodiments of the present disclosure, a method includes forming a gate stack over a fin structure of a semiconductor substrate; forming a spacer structure on a sidewall of the gate stack; removing a portion of the spacer structure to form a recessed face on the spacer structure, such that the spacer structure has a trench defined by the recessed face; depositing a dielectric layer on the gate stack and the spacer structure; and removing a portion of the dielectric layer outside the trench of the spacer structure to form a dielectric structure.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate having a fin structure;
a gate stack across the fin structure;
a spacer structure on a sidewall of the gate stack;
an epitaxial structure on the semiconductor substrate; and
a dielectric structure in the spacer structure and extending along a lower portion of the spacer structure and across the fin structure, wherein the dielectric structure has a sidewall facing and in contact with the epitaxial structure and having at least a portion lower than a top of the fin structure.

2. The semiconductor device according to claim 1, wherein the spacer structure comprises a first spacer layer, a second spacer layer, and a third spacer layer, and the second spacer layer is between the first spacer layer and the third spacer layer, and the second spacer layer has a lower dielectric constant than the first spacer layer and the third spacer layer.

3. The semiconductor device according to claim 2, wherein the second spacer layer is spaced apart from the epitaxial structure.

4. The semiconductor device according to claim 2, wherein the third spacer layer has a sidewall substantially aligned with a sidewall of the dielectric structure.

5. The semiconductor device according to claim 1, further comprising an etch stop layer and an interlayer dielectric over the epitaxial structure, wherein the etch stop layer is between the dielectric structure and the interlayer dielectric.

6. The semiconductor device according to claim 1, wherein the top of the fin structure has at least a portion that is lower than a top surface of the epitaxial structure and faces and is in contact with the dielectric structure.

7. The semiconductor device according to claim 1, wherein the dielectric structure has a lateral portion extending along the top of the fin structure, and a bottom surface of the lateral portion of the dielectric structure is lower than a top surface of the epitaxial structure.

8. A semiconductor device, comprising:
a semiconductor substrate having a fin structure;
a gate stack over the fin structure;
a spacer structure over the fin structure and on a sidewall of the gate stack, and having a recessed face with a curved shape at a position proximal to the fin structure; and
a dielectric structure in the spacer structure and having an inner face conformal to the recessed face of the spacer structure.

9. The semiconductor device according to claim 8, wherein the recessed face faces away from the gate stack.

10. The semiconductor device according to claim 8, wherein the inner face of the dielectric structure is in contact with the recessed face of the spacer structure.

11. The semiconductor device according to claim 8, wherein the dielectric structure extends in an extension direction along the recessed face of the spacer structure.

12. The semiconductor device according to claim 11, wherein the dielectric structure has non-uniform thicknesses in a direction substantially perpendicular to the extension direction of the dielectric structure.

13. The semiconductor device according to claim 12, wherein a thickness of the dielectric structure at a center of the dielectric structure is greater than a thickness of the dielectric structure at a side of the dielectric structure.

14. The semiconductor device according to claim 8, further comprising a first dielectric feature and a second dielectric feature over the semiconductor substrate, wherein a top surface of the first dielectric feature is lower than a top surface of the second dielectric feature.

15. The semiconductor device according to claim 14, wherein the dielectric structure is above the top surface of the first dielectric feature.

16. A method, comprising:
    forming a gate stack over a fin structure of a semiconductor substrate;
    forming a spacer structure on a sidewall of the gate stack;
    removing a portion of the spacer structure to form a recessed face on the spacer structure, such that the spacer structure has a trench defined by the recessed face;
    depositing a dielectric layer on the gate stack and the spacer structure; and
    removing a portion of the dielectric layer outside the trench of the spacer structure to form a dielectric structure.

17. The method according to claim 16, wherein depositing the dielectric layer on the spacer structure is such that the dielectric layer is deposited on the recessed face of the spacer structure.

18. The method according to claim 16, further comprising:
    forming a fin recess in the fin structure; and
    forming an epitaxial structure protruding from the fin recess such that the epitaxial structure in contact with the dielectric structure.

19. The method according to claim 18, further comprising:
    forming an etch stop layer over the epitaxial structure; and
    forming an interlayer dielectric over the etch stop layer.

20. The method according to claim 16, wherein forming the spacer structure on the sidewall of the gate stack comprises:
    forming a first spacer layer on the gate stack;
    forming a second spacer layer on the first spacer layer; and
    forming a third spacer layer on the second spacer layer, wherein the first spacer layer, the second spacer layer, and the third spacer layer are made of different materials.

* * * * *